US010982143B2

(12) United States Patent
Schmidt et al.

(10) Patent No.: US 10,982,143 B2
(45) Date of Patent: Apr. 20, 2021

(54) WAVELENGTH CONVERTING MATERIAL FOR A LIGHT EMITTING DEVICE

(71) Applicant: Lumileds LLC, San Jose, CA (US)

(72) Inventors: Peter Josef Schmidt, Aachen (DE); Philipp-Jean Strobel, Aachen (DE); Wolfgang Schnick, Gauting (DE)

(73) Assignee: Lumileds LLC, San Jose, CA (US)

( * ) Notice: Subject to any disclaimer, the term of this patent is extended or adjusted under 35 U.S.C. 154(b) by 133 days.

(21) Appl. No.: 16/252,001

(22) Filed: Jan. 18, 2019

(65) Prior Publication Data

US 2019/0225881 A1    Jul. 25, 2019

(30) Foreign Application Priority Data

Jan. 19, 2018   (EP) ..................... 18152482

(51) Int. Cl.
| | |
|---|---|
| *C09K 11/77* | (2006.01) |
| *C09K 11/55* | (2006.01) |
| *F21V 9/30* | (2018.01) |
| *H01L 33/50* | (2010.01) |
| *F21Y 115/10* | (2016.01) |

(52) U.S. Cl.
CPC .......... *C09K 11/7734* (2013.01); *C09K 11/55* (2013.01); *C09K 11/7721* (2013.01); *F21V 9/30* (2018.02); *H01L 33/502* (2013.01); *F21Y 2115/10* (2016.08)

(58) Field of Classification Search
CPC ............ C09K 11/7728; C09K 11/7734; C09K 11/7715; C09K 11/77; C09K 11/55; C09K 11/0883
See application file for complete search history.

(56) References Cited

U.S. PATENT DOCUMENTS 7,611,642 B2   11/2009   Takahashi et al.

FOREIGN PATENT DOCUMENTS

| CN | 102216419 A | 10/2011 |
|---|---|---|
| EP | 1571194 A1 | 9/2005 |
| EP | 1595934 A2 | 11/2005 |

OTHER PUBLICATIONS

Wondratscheck et al., "International Tables for Crystallography, vol. A1, Symmetry Relations Between Space Groups," Kluwer Academic Publishers, Dordrecht (2004).
International Search Report corresponding to PCT/EP2019/050559, dated Mar. 19, 2019, 1 page.
International Search Report and Written Opinion from the EPO as the ISA corresponding to PCT/EP2019/050559; dated Mar. 19, 2019, 8 pages.

*Primary Examiner* — C Melissa Koslow (57) ABSTRACT

Embodiments of the invention include a light source and a nitridoberyllate phosphor disposed in a path of light emitted by the light source. The nitridoberyllate phosphor includes a trigonal planar $BeN_3$ structure and/or a tetrahedral $Be(N,O)_4$ structure.

14 Claims, 6 Drawing Sheets

WAVELENGTH CONVERTING MATERIAL FOR A LIGHT EMITTING DEVICE

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III V semiconductors, particularly binary, ternary, and quaternary alloys of gallium, aluminum, indium, and nitrogen, also referred to as III nitride materials. Typically, III nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. Such devices are often referred to as phosphor-converted LEDs, or PCLEDs. The wavelength converting material absorbs light emitted by the LED and emits light of a different, longer wavelength.

SUMMARY

Embodiments of the invention include a light source and a nitridoberyllate phosphor disposed in a path of light emitted by the light source. The nitridoberyllate phosphor includes a trigonal planar $BeN_3$ structure and/or a tetrahedral $Be(N,O)_4$ structure.

DETAILED DESCRIPTION OF THE PREFERRED EMBODIMENTS

Embodiments of the invention include phosphors that are suitable for use with LEDs or other semiconductor light emitting devices. Phosphors typically include a host lattice and at least one dopant species. The atoms of the dopant species function as light emitting centers.

In some embodiments, the host lattice is a nitridoberyllate material. The beryllium cation $Be^{2+}$ is a small and polarizing cation that may be incorporated in nitride or oxonitride phosphor host lattices. $Be^{2+}$ may substitute, for example, for other cations such as $Li^+$ or $Mg^{2+}$. Compared to Li and Mg, Be has a smaller cation size, which may lead to more covalent bonding, for example in nitride or other suitable materials, and thus to higher host lattice stability. In tetrahedral coordination, $Be^{2+}$ is comparable in size to $Si^{4+}$ (for example, with an effective ionic radius of 40-41 pm). The substitution of $Be^{2+}$ for $Si^{4+}$ may allow for the synthesis of stable (oxido)nitrido beryllate, (oxido)nitride beryllate silicate, or (oxido)nitride beryllate aluminate host lattices.

In some embodiments, the host lattice includes trigonal planar beryllium bearing structures, such as, for example, $[BeN_3]^{7-}$, $[BeN_2O]^{6-}$, $[BeNO_2]^{5-}$, and $[BeO_3]^{4-}$. In some embodiments, the host lattice includes tetrahedral beryllium bearing structures, such as, for example, $[BeN_4]^{10-}$, $[BeON_3]^{9-}$, $[BeO_2N_2]^{8-}$, $[BeO_3N]^{7-}$, $[BeO_4]^{6-}$. $Be^{2+}$ may be the central ion of the triangles or tetrahedra.

For the host lattices described herein, the dopant species may be, for example, $Eu^{2+}$, $Ce^{3+}$, or any other suitable dopant species.

The phosphors according to some embodiments may have advantages over known phosphor systems. Phosphors according to some embodiments may be highly stable, for reliable operation of the PCLEDs. Phosphors according to some embodiments may have a large optical band gap, for high conversion efficiency. Large optical band gaps are desirable to provide a large energy barrier to non-radiative de-excitation processes which may occur at elevated temperatures, such as temperatures experienced during operation of the LEDs. Due to the high band gaps and larger energetic distances of exited states of $5d^1 \rightarrow 4f^{n-1}$ type activator ions to the conduction bands, $Eu^{2+}$ and/or $Ce^{3+}$ doped nitrodoberyllate phosphors show low luminescence losses due to thermal de-excitation at higher temperatures (i.e., the nitridoberyllate phosphors may have longer luminescence lifetimes, and higher quantum efficiency). Phosphors according to some embodiments may be chemically inert. Phosphors according to some embodiments may exhibit a desirable small Stokes shift and narrow band emission. Phosphors according to some embodiments may have desirable luminescence properties for use in PCLEDs.

In some embodiments, as described above, $Be^{2+}$ may replace the larger homologue $Mg^{2+}$ partially or fully. Examples of such phosphor materials showing $Eu^{2+}$ luminescence having a peak wavelength in the yellow to red spectral range include, for example, $Sr_2(Mg_{1-x}Be_x)_{1-y}Li_{0.5y}Al_{5+0.5y}N_7$:Eu ($0<x\leq1$, $0\leq y\leq1$, $K_2Zn_6O_7$ structure type), $SrMg_{3-x}Be_xSiN_4$:Eu ($0<x\leq2$, $NaLi_3SiO_4$ or $KLi_3GeO_4$ structure type), and $SrMg_{2-x}Be_xAl_2N_4$:Eu ($0<x\leq3$, $UCr_4C_4$ structure type).

In some embodiments, as described above, $Be^{2+}$ may replace Li partially or fully. Charge is balanced by changing the Si/Al ratio, such that a [Li,Si] pair is replaced by an isoelectronic [Be,Al] pair. Examples of such phosphor materials showing efficient narrow band luminescence in the green spectral range include, for example, $MLi_{2-x}Be_x$ $Al_{2+x}Si_{2-x}N_6$:Eu ($0<x\leq2$, M is Sr, Ba, or a mixture thereof; $BaLi_2Al_2Si_2N_6$ structure type) and $M_2Li_{1-x}Be_xAl_{1+x}Si_{7-x}N_{12}$:Eu ($0<x\leq1$, M is Sr, Ba, or a mixture thereof, $Ba_2LiAlSi_7N_{12}$ structure type).

Some of the above-described compounds, as well as other isotypic or homoeotypic variants, may contain $[BeN_4]^{10-}$ units as structural building blocks and show an eight-fold cuboidal coordination of the luminescent $Eu^{2+}$ cation in the structures.

In some embodiments, the nitridoberyllate phosphor is $M_{1-x}BeSi_2N_4$:Eu M is Ca, Sr, Ba, or a mixture thereof) or $M_{1-x}SrBe_6ON_4$:Eu$_x$ M is Ca, Sr, Ba, or a mixture thereof), $0<x<0.1$, $0.005\leq x\leq0.05$ in some embodiments.

Nitridoberyllate phosphors according to some embodiments can be prepared by using any suitable starting material, including, for example, beryllium powder, beryllium nitride ($Be_3N_2$), which is best prepared by heating beryllium powder in nitrogen atmosphere or in ammonia atmosphere, beryllium amide $Be(NH_2)_2$, beryllium oxide, beryllium halides, ammonium beryllium fluoride (($NH_4)_2BeF_4$), or any other suitable starting materials.

The phosphor materials described above can be manufactured, for example, in powder form, in ceramic form, or in any other suitable form. The phosphor materials may be formed into a structure that is formed separately from and can be handled separately from the light source, such as a prefabricated glass or ceramic tile, or may be formed into a structure that is formed in situ with the light source, such as a conformal or other coating formed on or above the light source.

In some embodiments, the phosphors described above may be powders that are dispersed for example in a transparent matrix, a glass matrix, a ceramic matrix, or any other suitable material or structure. The phosphor dispersed in a matrix may be, for example, singulated or otherwise formed into a tile that is disposed over a light source. The glass matrix may be for example a low melting glass with a softening point below 1000° C., or any other suitable glass or other transparent material. In some embodiments, the low melting glass belongs to the family of zinc bismuth borate glasses with a softening point below 600° C. and a refractive index larger than 1.75. In some embodiments, the low melting glass may further comprise barium and/or sodium, a softening point below 500° C. and a refractive index larger than 1.8. The ceramic matrix material can be for example a fluoride salt such as $CaF_2$ or any other suitable material.

The phosphors described above may be used in powder form, for example by mixing the powder phosphor with a transparent material such as silicone and dispensing or otherwise disposing the mixture in a path of light from the light source. In powder form, the average particle size (for example, particle diameter) of the phosphors may be at least 1 μm in some embodiments, no more than 50 μm in some embodiments, at least 5 μm in some embodiments, and no more than 20 μm in some embodiments. Individual phosphor particles, or powder phosphor layers, may be coated with one or more materials such as a silicate, a phosphate, and/or one or more oxides in some embodiments, for example to improve absorption and luminescence properties and/or to increase the material's functional lifetime.

Figure 1:
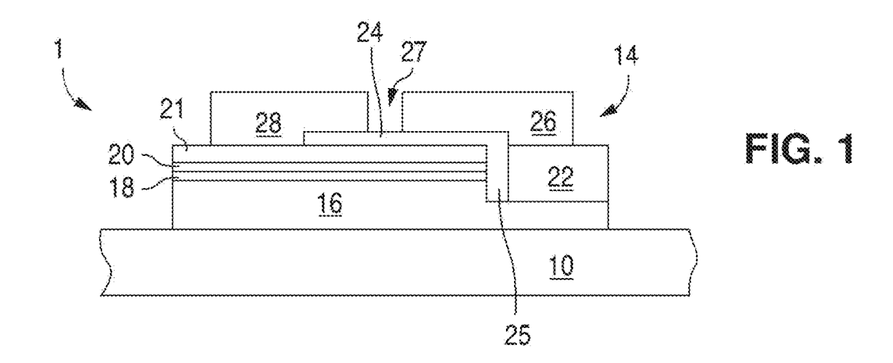
FIG. 1 is a cross sectional view of an LED.

The phosphors described above may be used, for example, in a light source including a light emitting diode (LED). Light emitted by the light emitting diode is absorbed by the phosphor according to embodiments of the invention and emitted at a different wavelength. FIG. 1 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used. In particular, the phosphors described above may be pumped by, for example, light sources such as LEDs emitting either in the blue (420-470 nm) or in the UV wavelength range.

FIG. 1 illustrates a III-nitride LED 1 that may be used in embodiments of the present invention. Any suitable semiconductor light emitting device may be used and embodiments of the invention are not limited to the device illustrated in FIG. 1. The device of FIG. 1 is formed by growing a III-nitride semiconductor structure 14 on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 1. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 1. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 1. The light source, such as, for example, the LED illustrated in FIG. 1, is illustrated in the following figures by block 1.

Figure 2:
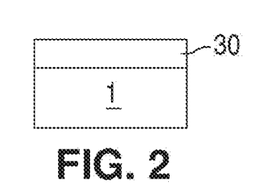
FIG. 2 is a cross sectional view of a device with a wavelength converting structure in direct contact with an LED.
Figure 3:
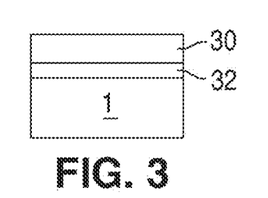
FIG. 3 is a cross sectional view of a device with a wavelength converting structure in close proximity to an LED.
Figure 4:
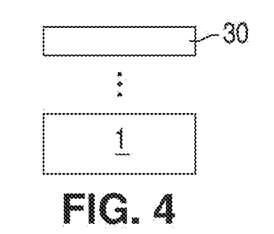
FIG. 4 is a cross sectional view of a device with a wavelength converting structure spaced apart from an LED.

FIGS. 2, 3, and 4 illustrate devices that combine an LED 1 and a wavelength converting structure 30. The wavelength converting structure 30 may include one or more phosphors, according to the embodiments and examples described above.

In FIG. 2, the wavelength converting structure 30 is directly connected to the LED 1. For example, the wavelength converting structure may be directly connected to the substrate 10 illustrated in FIG. 1, or to the semiconductor structure, if the substrate 10 is removed.

In FIG. 3, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 µm in some embodiments.

In FIG. 4, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

A device may also include other wavelength converting materials in addition to the phosphors described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

EXAMPLES

In some embodiments, the phosphor may be $AE_{1-x}RE_xBe_{1-y}Al_{0.5y}Si_{2+0.5y}N_{4+0.5y}$, where AE is Ca, Sr, Ba, or a mixture thereof; RE is Eu, Ce, or a mixture thereof; $0<x<0.1$; $0 \leq y<1$.

1. $SrBeSi_2N_4$:Eu(3.3%).

$SrBeSi_2N_4$:Eu can be prepared under nitrogen atmosphere and ambient pressure at 1500° C. from $Sr(NH_2)_2$, $Be_3N_2$, $Si(NH)_2$ and $EuF_3$ as dopant. In one example, 35.9 g (0.3 mole) $Sr(NH_2)_2$, 3.6 g (0.07 mole) $Be_3N_2$, 17.4 g (0.3 mole) "$Si(NH)_2$", and 0.6 mg (0.01 mole) $EuF_3$ are mixed and sintered under nitrogen atmosphere at 1500° C. for 6 h. The material shows plate-like particles and can be deagglomerated and milled into powder form by e.g. ball milling.

Figure 5:
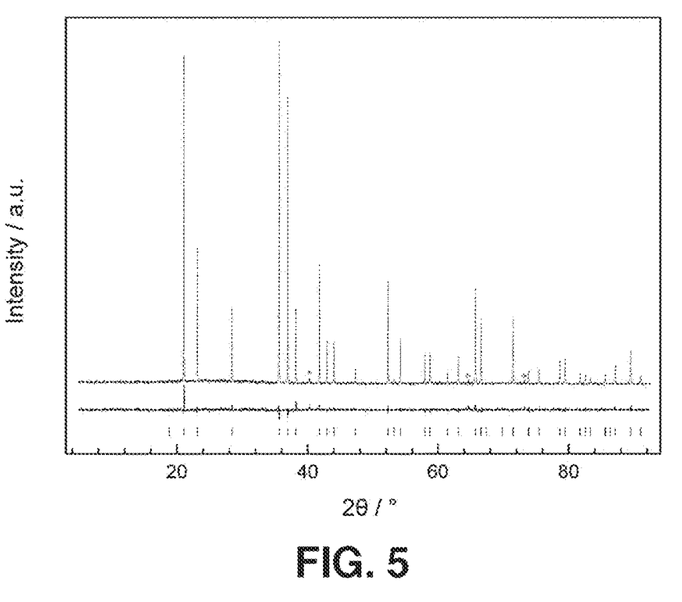
FIG. 5 is an x-ray diffraction pattern of $SrBeSi_2N_4$:Eu (3.3%).

FIG. 5 is an X-ray diffraction powder pattern (top curve) and Rietveld refinement (bottom curve) of $SrBeSi_2N_4$:Eu luminescent material (Cu Kα radiation). The vertical marks below the bottom curve are reflection positions of $SrBeSi_2N_4$:Eu. The asterisks imply an unknown impurity phase.

Figure 6:
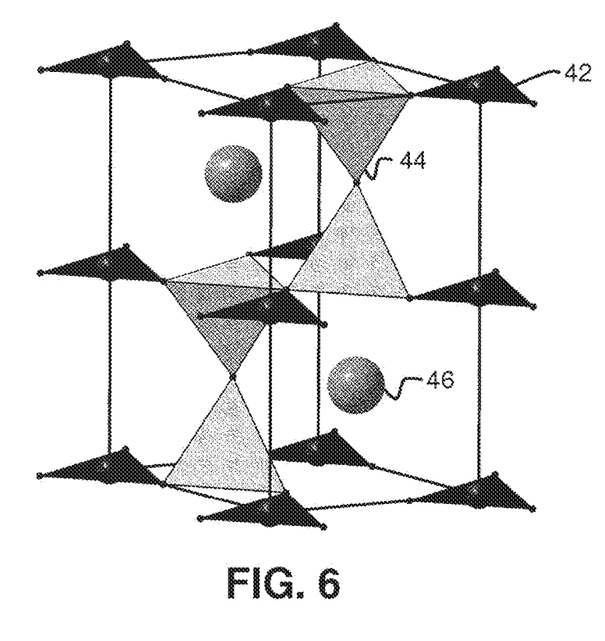
FIG. 6 illustrates the crystal structure of $SrBeSi_2N_4$:Eu.
Figure 7:
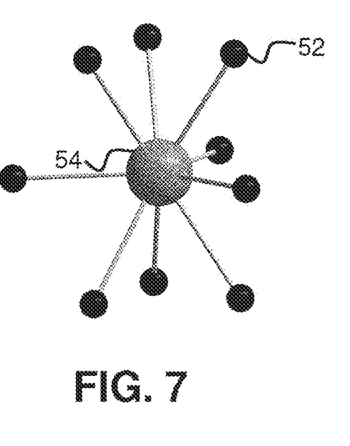
FIG. 7 illustrates the coordination sphere of Sr in $SrBeSi_2N_4$:Eu.

The highly condensed nitridoberyllosilicate $SrBeSi_2N_4$:Eu crystallizes in the hexagonal space group P$\bar{6}$2c, isotypic to $SrBe_3O_4$, with the cell parameters a=4.86082(2) and c=9.42263(4) Å. FIG. 6 illustrates the crystal structure of $SrBeSi_2N_4$:Eu. FIG. 7 illustrates a coordination sphere of Sr in the $SrBeSi_2N_4$:Eu material. The crystal structure of $SrBeSi_2N_4$:Eu is built from two building units: trigonal planar $[BeN_3]^{7-}$ units 42 are connected by common corners by $[Si_2N_7]^{6-}$ units 44, built from two corner-sharing $SiN_4$ tetrahedra, building a 3D-network structure. Base areas of $SiN_4$ tetrahedra, $BeN_3$ triangles and empty rings of three N1 atoms form layers of equilateral triangles in the (001) plane. Base areas of $SiN_4$ tetrahedra, $BeN_3$ triangles and empty rings of three N1 atoms form layers of equilateral triangles in the (001) plane. The Si—N2-Si angle is 180°. $N_2$ thus occupies a lattice site characterized by the Wyckoff position 2c. Sr (46 in FIG. 6; 54 in FIG. 7) is nine-fold coordinated by N 52. Six N atoms, contributing from the upper and lower lying $SiN_4$ tetrahedra, form a regular trigonal prism. Three N atoms are positioned in the equatorial plane, with an N2-Sr—N2 angle of 60°.

In the table below are atomic parameters of the $SrBeSi_2N_4$:Eu structure. Atom is the species that occupies a lattice site with a specific Wyckoff position. Headings x/a, y/b and z/c refer to the coordinates of the atomic positions in the crystal lattice defined by the lattice constants a, b and c. In the monoclinic lattice system a≠b≠c and α=γ=90° and β≠90°.

| Atom | Wyckoff position | x/a | y/b | z/c |
|---|---|---|---|---|
| Sr1 | 2d | 2/3 | 1/3 | ¼ |
| Si1 | 4f | 1/3 | 2/3 | 0.07006(11) |
| Be1 | 2a | 0 | 0 | 0 |
| N1 | 6q | 1/3 | 0 | 0 |
| N2 | 2c | 1/3 | 2/3 | ¼ |

An electron density map shows small amounts of electron density at 0,0,1/4 and 0,0,1/4$^{+}$/_z indicating additional disorder/under-occupation. Two Be atoms on 0,0,0 and 0,0,1 can be substituted with another $[Si_2N_7]^{6-}$ unit, leading to stronger condensation. This phenomenon is also found in isotypic $SrBe_{2-2x}Si_{2+3x}Al_{2-x}N_{8+x}$. Electron density scans of $SrBeSi_2N_4$:Eu show a Sr:Si ratio of 1:2. Be is difficult to analyze by electron density scanning due to the low atomic weight.

Figure 8:
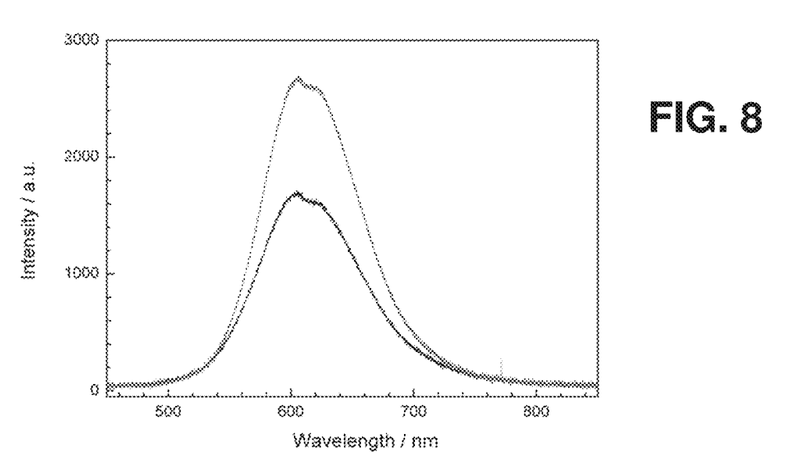
FIG. 8 is emission spectra for $SrBeSi_2N_4$:Eu (3.3%) at 450 nm excitation (top curve) and 385 nm excitation (bottom) curve.

FIG. 8 illustrates emission spectra of $SrBeSi_2N_4$:Eu (3.3%) when excited at 385 nm (bottom curve) and when excited at 450 nm (top curve). The emission is located in the orange-red spectral range with a peak position of ~615 nm and a spectral half width of 95 nm.

In some embodiments, the phosphor may be $AE_{1-x}R$-$E_xBe_{6-y-z}Mg_yAl_zO_{1-z}N_{4+z}$ with AE=Ca, Sr, Ba; RE=Eu, Ce; 0<x<0.1; 0≤y≤2; 0≤z≤1.

2. $SrBe_6ON_4$:Eu.

$SrBe_6ON_4$:Eu is synthesized under ambient pressure at 1500° C. In one example, 23.9 mg (0.2 mmole) $Sr(NH_2)_2$, 3.6 mg (0.07 mmole) $Be_3N_2$, 23.3 mg (0.4 mmole) "$Si(NH)_2$", and 0.4 mg (0.01 mmole) $EuF_3$ are mixed and sintered under $H_2/N_2$ (5/95) atmosphere at 1500° C. for 6 h. The raw phosphor material shows large crystal aggregates (>100 µm) and can be de-agglomerated and milled into powder form by e.g. ball milling or any other suitable technique.

$SrBe_6ON_4$:Eu crystallizes in space group C2/c (No. 15) with the cell parameters a=13.9283(14) Å, b=5.7582(6) Å and c=4.9908(5) Å, β=90.195(1). C2/c is the symbol of the crystallographic space group that describes the symmetry of the crystal lattice according to INTERNATIONAL TABLES FOR CRYSTALLOGRAPHY, Volume A1, SYMMETRY RELATIONS BETWEEN SPACE GROUPS. Eds. H. Wondratscheck and U. Mueller, Kluwer Academic Publishers, Dordrecht (2004). The table below summarizes the atomic parameters of the $SrBe_6ON_4$ crystal structure. Atom is the species that occupies a lattice site with a specific Wyckoff position. Headings x/a, y/b and z/c refer to the coordinates of the atomic positions in the crystal lattice defined by the lattice constants a, b and c. In the monoclinic lattice system a≠b≠c and α=γ=90° and β90°.

| Atom | Wyckoff position | x/a | y/b | z/c |
|---|---|---|---|---|
| Sr1 | 4e | 0 | 0.79693(3) | 1/4 |
| Be1 | 8f | 0.11175(11) | 0.3606(3) | 0.2454(5) |
| Be2 | 8f | 0.19608(14) | 0.1090(3) | 0.4375(4) |
| Be3 | 8f | 0.29673.(14) | 0.1393(3) | 0.1050(4) |
| O1 | 4e | 0 | 0.3381(2) | 1/4 |
| N1 | 8f | 0.33342(8) | 0.1126(2) | 0.4333(2) |
| N2 | 8f | 0.16922(9) | 0.1342(2) | 0.0981(2) |

Figure 9:
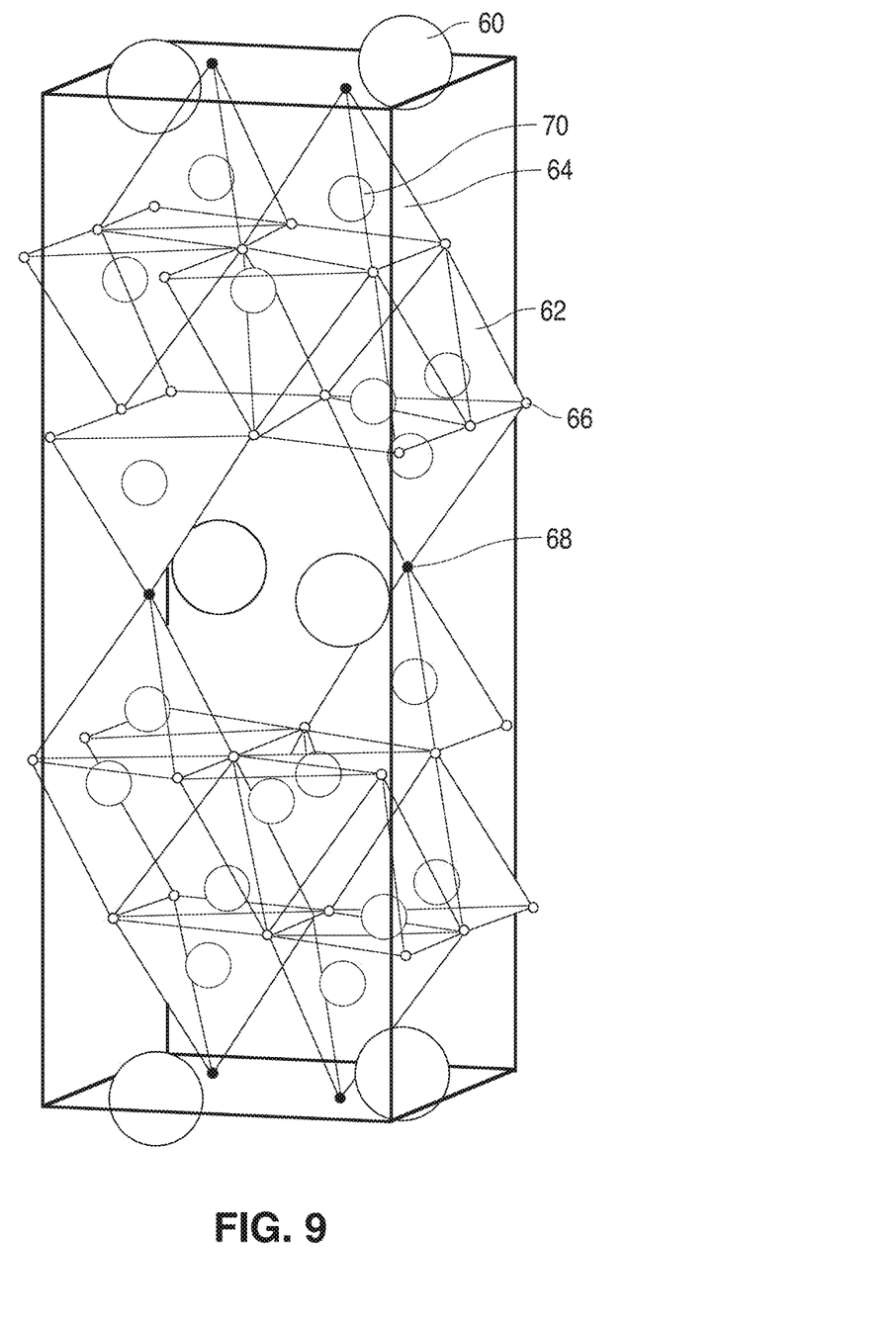
FIG. 9 illustrates the crystal structure of $SrBe_6ON_4$:Eu.
Figure 10:
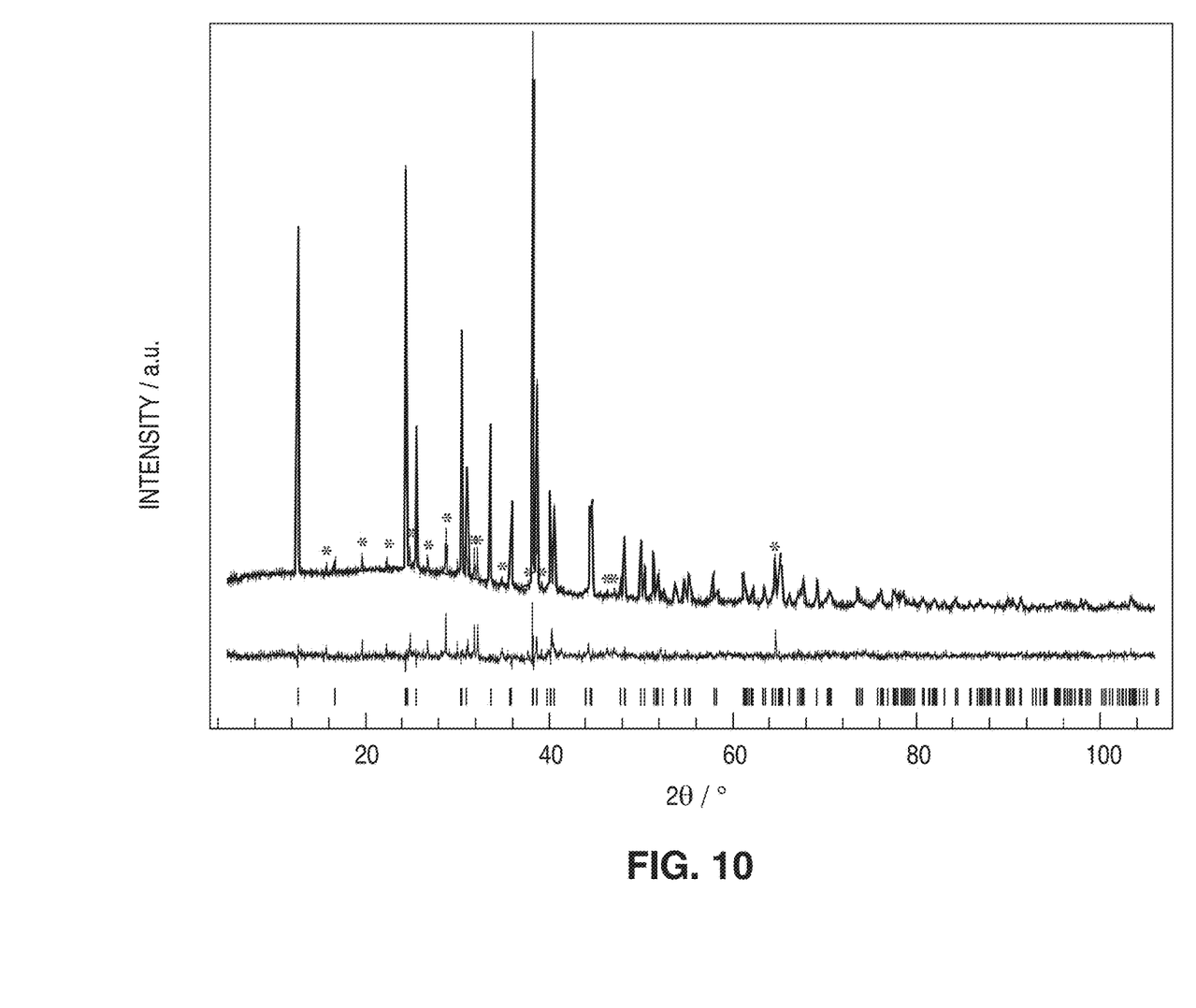
FIG. 10 is an x-ray diffraction pattern of $SrBe_6ON_4$:Eu.

FIG. 9 illustrates the crystal structure of $SrBe_6ON_4$:Eu. FIG. 10. is an X-ray diffraction pattern (top curve) and Rietveld refinement (bottom curve) of $SrBe_6ON_4$:Eu luminescent material.

The highly condensed oxonitridoberyllate $SrBe_6ON_4$:Eu crystallizes in the monoclinic space group C2/c (no. 15). Pseudo-orthorhombic metric is indicated by the Sr1 and O1 positions, but is disrupted by the arrangement of $BeN_4$-tetrahedra. This leads to a slightly distorted monoclinic symmetry with pseudo-orthorhombic metric and a deviation of β=90.195(1)°. This deviation is supported by PXRD Rietveld refinement (FIG. 10), showing split reflexes that confirm the monoclinic space group C2/c.

The crystal structure can be described as a highly condensed 3D-network, displayed in FIG. 9. $Sr[Be_6ON_4]$ is built from layers of edge-sharing $BeN_4$ tetrahedra, resulting in an extremely large degree of condensation κ=6/5, exceeding values that are known from nitridosilicate and aluminate structures (κ≤1). Each $BeN_4$ tetrahedron 62 shares common edges with three $BeN_4$ tetrahedra, leading to a slightly tilted, highly condensed layer. The layers are interconnected by two O-sharing $BeON_3$ tetrahedra 64, building $Be_2ON_6$ units that are connected to the layers by common edges with $BeN_4$ tetrahedra. As a result of this combination of vertex-sharing of four $BeN_4$ and one $BeON_3$ tetrahedra, N atoms bridge five $BeX_4$ (X=O,N) tetrahedra. (Be is indicated by 70 in FIG. 9.)

Additional space in between the layers and between $Be_2ON_6$ units is occupied by Sr atoms 60. The Sr atoms 60 are in anti-prismatic coordination by six N 66, with distances between 2.7 and 3.1 Å and four equatorial O 68 in a distance of 2.6 Å (3×) as well as one more distant O (3.1 Å).

Figure 11:
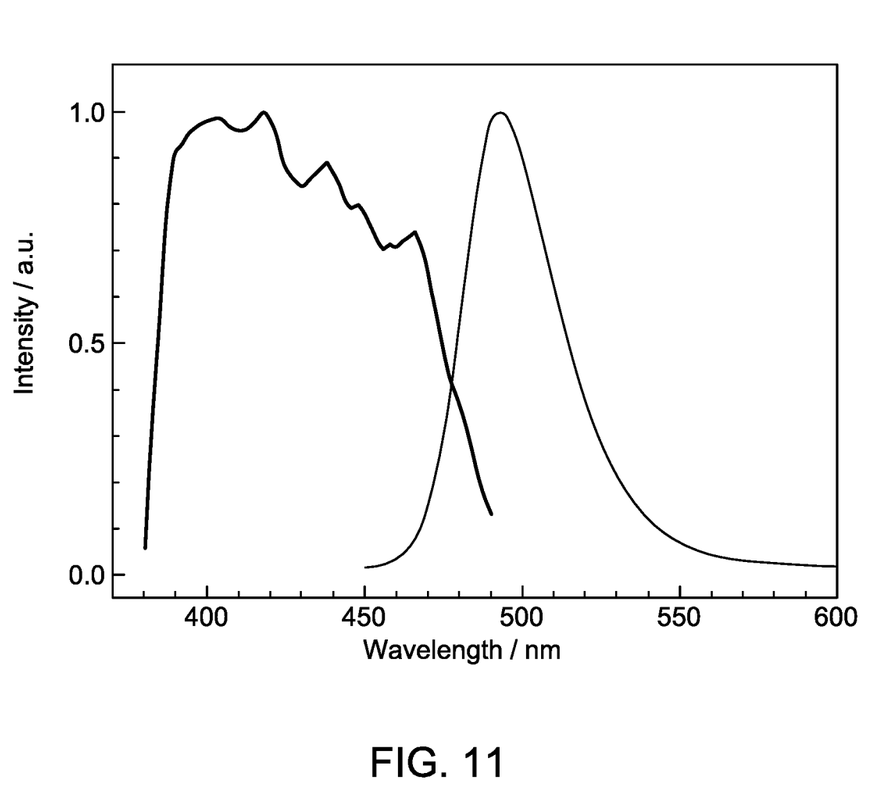
FIG. 11 illustrates the excitation and emission at 450 nm excitation for $SrBe_6ON_4$:Eu.

FIG. 11 illustrates the excitation and emission spectra of $SrBe_6ON_4$:Eu. The black curve is the excitation spectrum; the gray curve is the emission spectrum at 450 nm excitation. Emission peaks at $\lambda_{em}$=495 nm, with spectral full width at half maximum (fwhm)=35 nm (1420 cm$^{-1}$).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A luminescent material comprising:
a host lattice comprising a tetrahedral $Be(N,O)_4$ structure; and
a dopant species.

2. The luminescent material of claim 1 wherein the dopant species is either Eu or Ce.

3. The luminescent material of claim 1 wherein the host lattice is $SrBe_6ON_4$.

4. The luminescent material of claim 1 wherein the host lattice is $M_{1-x}SrBe_6ON_4$ where M is Ca, Sr, Ba, or a mixture thereof and the dopant species is $Eu_x$ where 0<x≤0.1.

5. A device comprising:
a light source; and
a nitridoberyllate phosphor disposed in a path of light emitted by the light source, the nitridoberyllate phosphor comprising a tetrahedral $Be(N,O)_4$ structure.

6. The device of claim 5 wherein the nitridoberyllate phosphor is disposed in a transparent matrix.

7. The device of claim 5 wherein the nitridoberyllate phosphor is selected from the group consisting of $SrBe_6ON_4$:Eu and $M_{1-x}SrBe_6ON_4$:$Eu_x$ where M is Ca, Sr, Ba, or a mixture thereof and 0<x≤0.1.

8. A luminescent material comprising:
a host lattice comprising a trigonal planar $BeN_3$ structure; and
a dopant species.

9. The luminescent material of claim 8 wherein the host lattice is $SrBeSi_2N_4$.

10. The luminescent material of claim 8 wherein the host lattice is $M_{1-x}BeSi_2N_4$ where M is Ca, Sr, Ba, or a mixture thereof and the dopant species is $Eu_x$ where $0<x\le0.1$.

11. The luminescent material of claim 8 wherein the dopant species is either Eu or Ce.

12. A device comprising:
   a light source; and
   a nitridoberyllate phosphor disposed in a path of light emitted by the light source, the nitridoberyllate phosphor comprising a trigonal planar $BeN_3$ structure.

13. The device of claim 12 wherein the nitridoberyllate phosphor is disposed in a transparent matrix.

14. The device of claim 12 wherein the nitridoberyllate phosphor is selected from the group consisting of $SrBeSi_2N_4$:Eu and $M_{1-x}BeSi_2N_4$:$Eu_x$ where M is Ca, Sr, Ba, or a mixture thereof and $0<x\le0.1$.

\* \* \* \* \*